United States Patent [19]
Hori

[11] Patent Number: 5,583,371
[45] Date of Patent: Dec. 10, 1996

[54] RESIN-SEALED SEMICONDUCTOR DEVICE CAPABLE OF IMPROVING IN HEAT RADIATION CHARACTERISTICS OF RESIN-SEALED SEMICONDUCTOR ELEMENTS

[75] Inventor: Masahiko Hori, Yokohama, Japan

[73] Assignee: Kabushiki Kaisha Toshiba, Kawasaki, Japan

[21] Appl. No.: 532,110

[22] Filed: Sep. 22, 1995

[30] Foreign Application Priority Data

Oct. 12, 1994 [JP] Japan ..................... 6-246080

[51] Int. Cl.⁶ .................... H01L 23/495; H01L 23/28
[52] U.S. Cl. .............. 257/675; 257/676; 257/796
[58] Field of Search .................... 257/666, 675, 257/676, 796

[56] References Cited

U.S. PATENT DOCUMENTS

| | | | |
|---|---|---|---|
| 5,227,662 | 7/1993 | Ohno et al. | 257/676 |
| 5,245,215 | 9/1993 | Sawaya | 257/676 |
| 5,248,895 | 9/1993 | Nakazawa | 257/676 |
| 5,252,855 | 10/1993 | Ogawa et al. | 257/676 |
| 5,321,204 | 6/1994 | Ko | 257/676 |
| 5,349,238 | 9/1994 | Ohsawa et al. | 257/666 |

FOREIGN PATENT DOCUMENTS

| | | | |
|---|---|---|---|
| 0012341 | 1/1983 | Japan | 257/675 |
| 0240053 | 10/1988 | Japan | 257/796 |
| 0222464 | 10/1991 | Japan | 257/796 |
| 0211262 | 8/1993 | Japan | 257/675 |

*Primary Examiner*—Sara W. Crane
*Assistant Examiner*—David Ostrowski
*Attorney, Agent, or Firm*—Finnegan, Henderson, Farabow, Garrett & Dunner, L.L.P.

[57] ABSTRACT

A resin-sealed semiconductor device according to the present invention, a heat radiation plate is formed around a bed on which a semiconductor chip is mounted. The bed and heat radiation plate are partially connected to each other by connecting pins. The connecting pins are inclined by depression to locate the heat radiation plate higher than the bed. A lead frame is fixed onto the undersurface of the heat radiation plate by an insulation tape made of a thermoplastic tape. Inner leads of lead terminals of the lead frame and electrode pads on the semiconductor chip are then bonded by Au wires, respectively. After that, the semiconductor chip is sealed with resin and outer leads of the lead terminals are formed to have a predetermined shape. Since the lead frame is fixed onto the undersurface of the heat radiation plate, the insulation tape is not required immediately under the bonding points on the inner leads. Thus, heat generated from a heat source can be transmitted to the inner leads with high efficiency, and stable bonding can be performed without being influenced by the insulation tape.

10 Claims, 6 Drawing Sheets

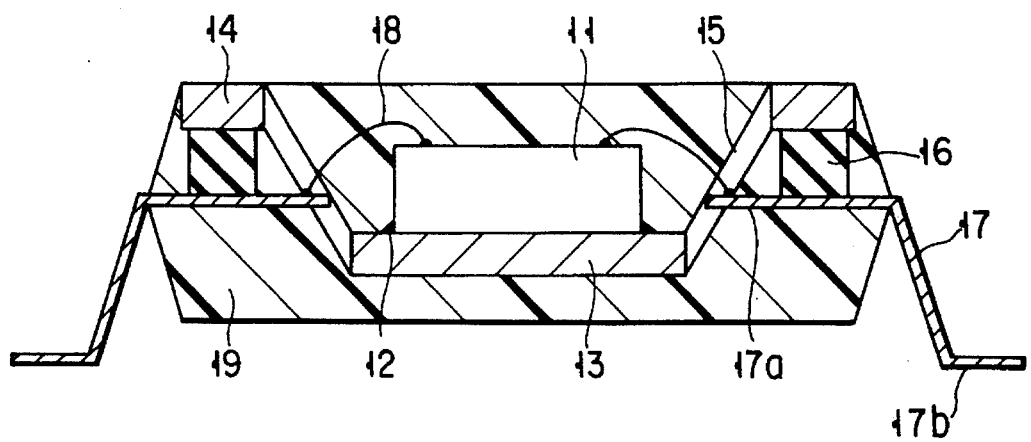
F I G. 5
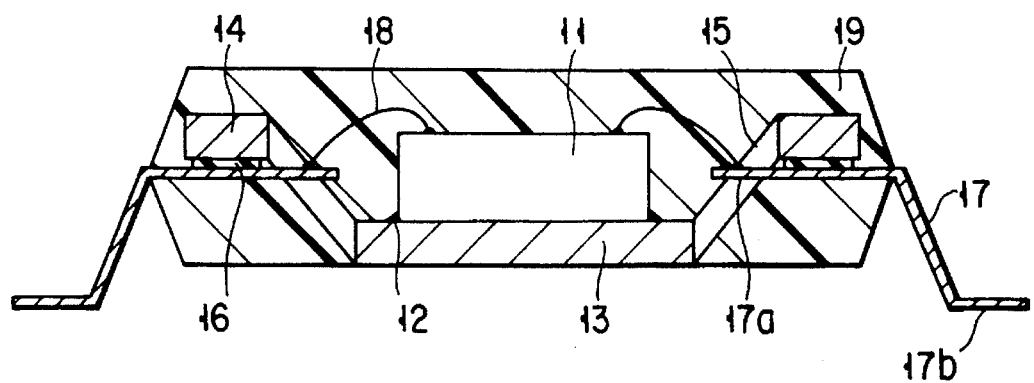
F I G. 6

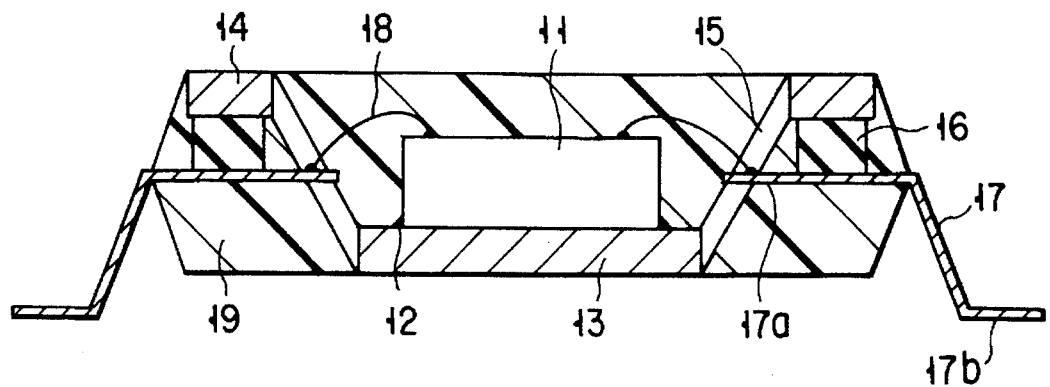
F I G. 7
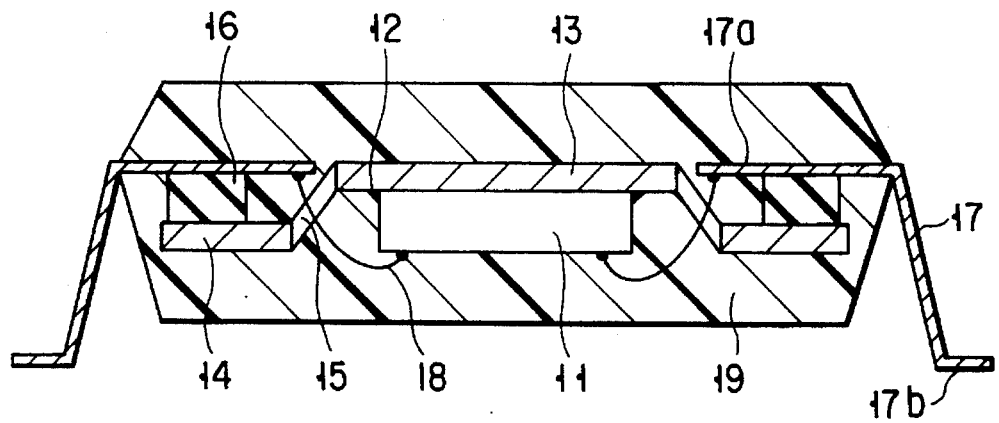
F I G. 8
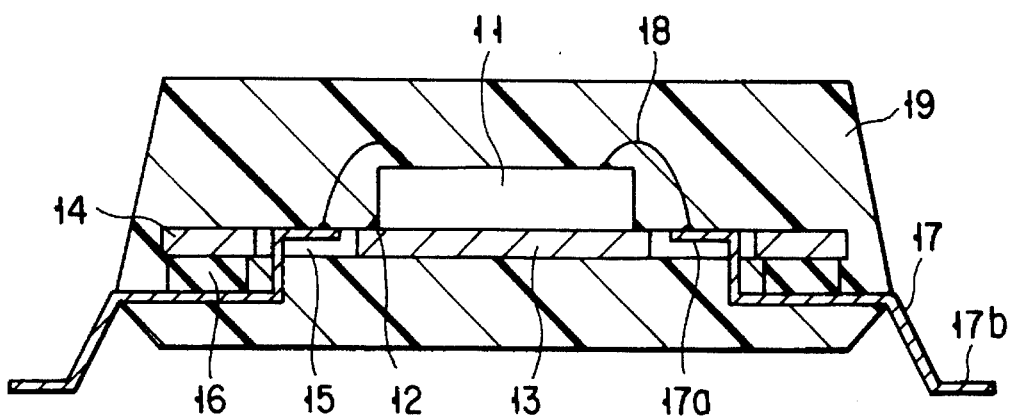
F I G. 9

RESIN-SEALED SEMICONDUCTOR DEVICE CAPABLE OF IMPROVING IN HEAT RADIATION CHARACTERISTICS OF RESIN-SEALED SEMICONDUCTOR ELEMENTS

BACKGROUND OF THE INVENTION

1. Field of the Invention

The present invention relates to a resin-sealed semiconductor device capable of improving in heat radiation characteristics of resin-sealed semiconductor elements.

2. Description of the Related Art

In a resin-sealed semiconductor device wherein a semiconductor chip is sealed with resin, the chip can be protected from dust and the like. In another resin-sealed semiconductor device wherein a large-sized semiconductor chip is sealed with resin at high power, the heat radiation characteristics of the chip can be enhanced using a heat radiating plate.

FIG. 1 is a cross-sectional view of a prior art resin-sealed semiconductor device capable of improving in heat radiation characteristics. In this device, a semiconductor chip 1 is mounted on a bed (heat radiation plate) 3 by die bonding paste 2. An inner lead 5a of each of lead frames 5 is adhered onto the bed 3 by an insulation tape 4. The bed 3 and lead frames 5 are formed of copper (Cu) having high thermal conductivity. For the insulation tape 4, a thermosetting tape or a thermoplastic tape having a high glass transition temperature is used.

Electrodes 1a of the semiconductor chip 1 are bonded to the inner leads 5a of the lead frames 5 by gold (Au) wires 6, respectively. The semiconductor chip 1 including the respective bonding points, is packaged by mold resin 7. An outer leak 5b of each of the lead frames 5 is formed to have a predetermined shape after the packaging.

In the resin-sealed semiconductor device with the above constitution, the heat generated from the semiconductor chip 1 is radiated outside through the bed 3 and the lead frames 5 adhered to the bed 3. However, the semiconductor device has the following drawbacks since the inner leads 5a are adhered onto the bed 3 by their respective insulation tapes 4.

If, as shown in FIG. 2, the insulation tapes 4 are thermosetting tapes, a tape curing step of hardening the tapes by heat is required after the lead frames 5 are attached to the bed 3. During the tape curing, the tapes generate an out gas. The out gas is stuck to the inner leads 5a to remarkably decrease in bonding between the inner leads 5a and gold wires 6. The out gas can be removed from the inner leads 5a by cleaning after the tape curing; however, the number of steps is increased by one, as is the manufacturing cost accordingly.

The inner leads 5a are also contaminated with the out gas generated from the tapes in a step of curing the die bonding paste 2. However, in this case, the gas stuck to the inner leads 5a cannot be removed by cleaning in consideration of damage to the semiconductor chip 1.

If, as shown in FIG. 3, the insulation tapes 4 are thermoplastic tapes, no curing step is needed since the thermoplastic tapes are softened at a high temperature to adhere the leads frames 5 to the bed 3 and then hardened at a normal temperature to fix them to each other. The contamination of the inner leads 5a due to the outer gas is not a serious problem as compared with the case where the thermosetting tapes are employed. Consequently, when the thermoplastic tapes are used, both the curing and cleaning steps are unnecessary and thus the number of manufacturing steps can be smaller than when the thermosetting tapes are used.

Generally-used thermoplastic tapes are easily softened at a temperature required for wire bonding, so that they make the adhesion of bed 3 and inner leads 5a unstable. More specifically, at the time of wire bonding, a heat source (not shown) is placed under the bed 3, and inner leads 5a are kept at a temperature suitable for bonding the inner leads 5a to the gold wires 6. Since the thermoplastic tapes are formed immediately under the bonding points at which the inner leads 5a and gold wires 6 are bonded to each other, they are easily softened at the temperature for the bonding and thus cannot support the inner leads 5a against the force applied from above during the bonding. The deterioration in adhesion of the inner leads 5a to the bed 3 greatly lowers the bonding characteristics.

To prevent the deterioration in adhesion, it is possible to use thermoplastic tapes which are softened at a temperature higher than that required for the bonding. In this case, however, the lead frames 5 have to be adhered to the bed 3 at a very high temperature, with the result that the tapes are greatly expanded, and the lead frames are warped when they are hardened at a normal temperature.

If, furthermore, the temperature for bonding is lowered, the bonding between the inner leads 5a and gold wires 6 deteriorates.

In both the cases described above, the prior art resin-sealed semiconductor device is structurally poor in (efficiency) transmission of heat from the heat source to the bonding points. More specifically, since each insulation tape 4 is interposed between the bed 3 and inner lead 5a, the heat generated from the heat source provided under the bed 3 is hard to transmit to the inner lead 5a. Therefore, the structure of the prior art device is very disadvantageous to achievement of good bonding.

SUMMARY OF THE INVENTION

An object of the present invention is to provide a resin-sealed semiconductor device capable of improving in wire bonding without deteriorating in heat radiation characteristics.

According to an aspect of the present invention, there is provided a resin-sealed semiconductor device comprising:

a semiconductor element having a plurality of electrodes;

an element mounting section on which the semiconductor element is mounted;

a heat radiation section formed around and spaced away from the element mounting section and partially connected to the element mounting section;

a plurality of lead wires fixed onto an undersurface of the heat radiation section, end portions of the plurality of lead wires extending to openings formed by the element mounting section and the heat radiation section and being bonded to the plurality of electrodes of the semiconductor element; and a sealing member for sealing the semiconductor element including bonding points of the plurality of lead wires.

According to another aspect of the present invention, there is provided a resin-sealed semiconductor device comprising:

a semiconductor element having a plurality of electrodes;

an element mounting section on which the semiconductor element is mounted;

a heat radiation section formed around and spaced away from the element mounting section and partially connected to the element mounting section;

a plurality of lead wires fixed onto an undersurface of the heat radiation section, end portions of the plurality of lead wires extending to openings formed by the element mounting section and the heat radiation section and being bonded to the plurality of electrodes of the semiconductor element; and a sealing member for sealing the semiconductor element, including bonding points of the plurality of lead wires, at least when one of the heat radiation section and the element mounting section is exposed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a schematic cross-sectional view of the resin-sealed semiconductor device shown in FIG. 4A in which a heat radiation plate is exposed from a resin surface;

FIG. 6 is a schematic cross-sectional view of the resin-sealed semiconductor device shown in FIG. 4A in which a bed is exposed from a resin surface;

FIG. 7 is a schematic cross-sectional view of the resin-sealed semiconductor device shown in FIG. 4A in which a bed is exposed from a resin surface;

FIG. 8 is a schematic cross-sectional view of the resin-sealed semiconductor device shown in FIG. 4A in which the outer leads are formed in the opposite direction;

FIG. 9 is a schematic cross-sectional view of the resin-sealed semiconductor device shown in FIG. 4A in which a heat radiation plate and a bed are arranged on the same plane;

DETAILED DESCRIPTION OF THE PREFERRED EMBODIMENTS

Embodiments of the present invention will now be described with reference to the accompanying drawings.

Figure 1:
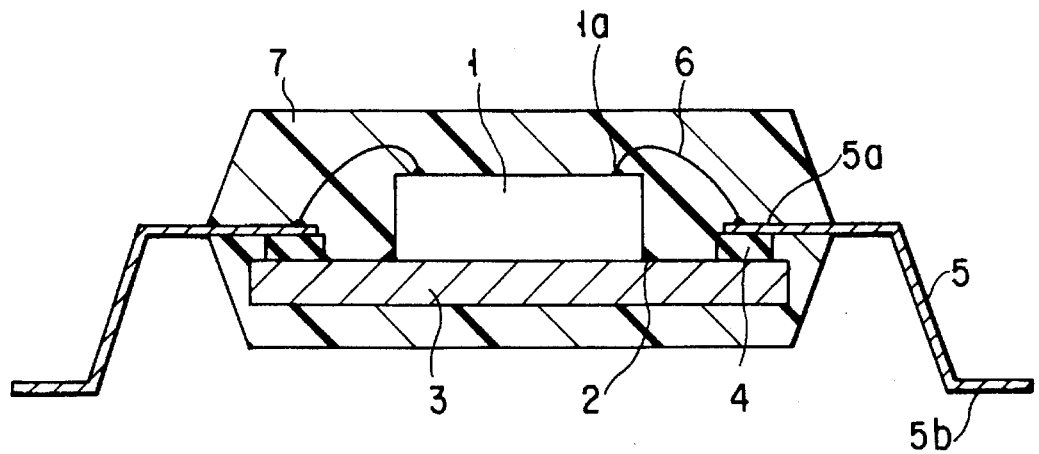
FIG. 1 is a cross-sectional view schematically showing a prior art resin-sealed semiconductor device capable of improving in heat radiation characteristics in order to explain the problems thereof.
Figure 2:
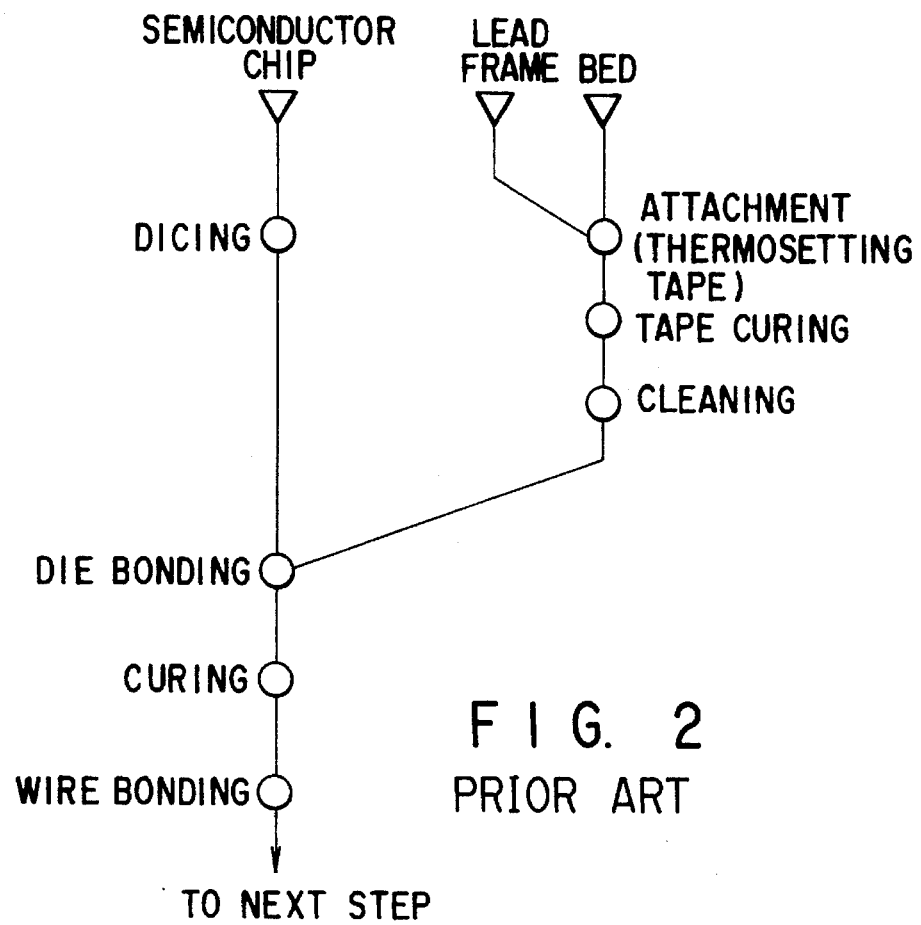
FIG. 2 is a flowchart showing a manufacturing process of the prior art resin-sealed semiconductor device using thermosetting tapes.
Figure 3:
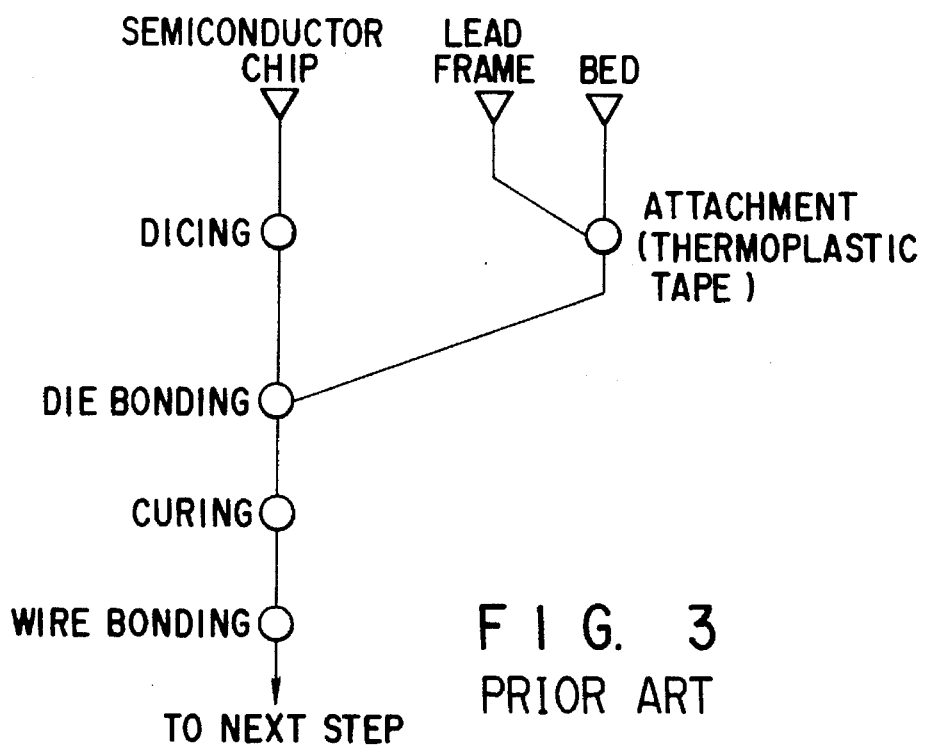
FIG. 3 is a flowchart showing a manufacturing process of the prior art resin-sealed semiconductor device using thermoplastic tapes.
Figure 4A:
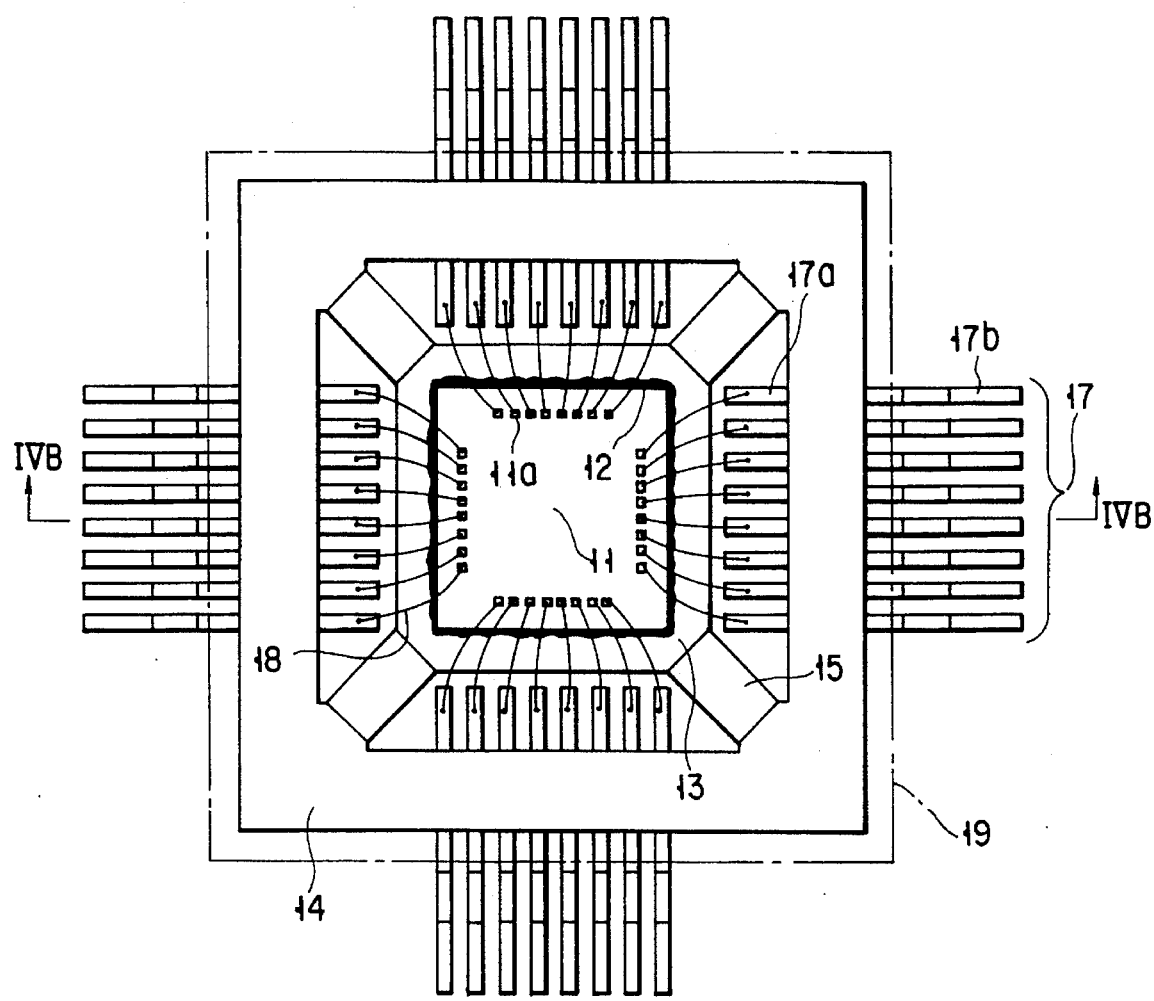
FIG. 4A is a plan view schematically showing the constitution of a resin-sealed semiconductor device (QFP type device) according to a first embodiment of the present invention.
Figure 4B:
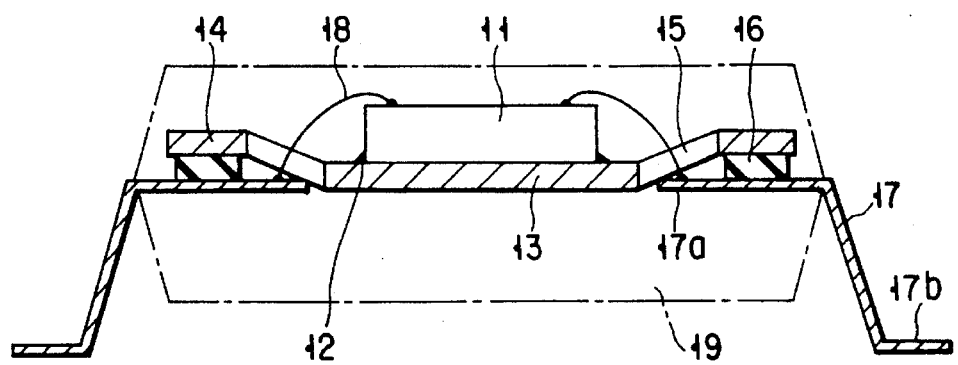
FIG. 4B is a schematic cross-sectional view taken along the line IVB—IVB of FIG. 4A.

FIGS. 4A and 4B show a QFP (Quad Flat Package) type resin-sealed semiconductor device according to a first embodiment of the present invention. FIG. 4A is a plan view showing the inside of the resin-sealed semiconductor device, and FIG. 4B is a schematic cross-sectional view taken along the line IVB–IVB of FIG. 4A.

A semiconductor chip 11 is mounted on a bed 13 by die bonding paste 12 and its shape is almost square. A plurality of electrode pads 11a are formed on the surface of the semiconductor chip 1 and arranged along the respective sides thereof. A heat radiation plate 14 is provided around the bed 13 with a fixed space therebetween and partially connected to the bed by means of connecting pins 15. The bed 13 and heat radiation plate 14 are formed integrally as one component using a copper (Cu) plate of high thermal conductivity.

For example, by etching or punching the Cu plate, the bed 13 is shaped almost squarely and slightly larger than the semiconductor chip 11, and the heat radiation plate 14 is formed like a frame surrounding the bed 13. The bed 13 and heat radiation plate 14 are connected at respective four corners by the connecting pins 15. The plate 14 is spaced away from the bed 13 by the length of each connecting pin 15. A substantially trapezoidal opening is formed between the bed 13 and each side of the heat radiation plate 14. The connecting pins 15 are inclined by depression such that the heat radiation plate 14 is located on the level higher than that of the bed 13.

A lead frame 17 is bonded to the undersurface of the heat radiation plate 14 through an insulation tape 16 and includes a plurality of lead wires each having an inner lead 17a and an outer lead 17b. The inner leads 17a of the lead wires extend to the substantially trapezoidal openings. The lead frame 17 is formed by etching or punching, e.g., a metallic thin plate, and the lead wires thereof are formed integrally as one component by connecting the outer leads 17b to one another. A thermoplastic tape, which is softened at a temperature of about 120° C., is employed as the insulation tape 16.

In the openings, the inner leads 17a are electrically bonded to the electrode pads 11a of the chip 11 by gold (Au) wires 18, respectively. The bonding using the Au wires is performed at a temperature suitable for bonding the inner leads 17a and Au wires 18, the temperature being maintained by a heat source (not shown) placed under the bed 13 including the inner leads 17a. If the undersurfaces of the inner leads 17a are substantially flush with that of the bed 13, heat generated from the heat source can be transmitted directly to the inner leads 17a but not through the insulation tape 16. The heat can be efficiently transmitted to the bonding points on the inner leads 17a, and the inner leads 17a can be supported from below when bonding. The device of the first embodiment is structurally advantageous to achievement of good bonding.

Furthermore, the insulation tape 16 is not formed immediately under the bonding points, i.e., under the inner leads 17a. Even though the thermoplastic (insulation) tape 16 is softened at a temperature for bonding, the bonding characteristic does not deteriorate.

The semiconductor chip 11 is packaged by resin 19, together with the bed 13, heat radiation plate 14, and bonding points on the inner leads 17a. This packaging is performed by transfer-mold wherein the semiconductor chip 11 is put between upper and lower molds (not shown), melted resin 19 is caused to flow into the cavity of the molds and the molds are removed after the resin 19 is hardened sufficiently.

When the packaging is completed, the outer leads 17b are formed at once so as to have a predetermined shape and separated from one another.

The device according to the first embodiment is so constituted that heat generated from the semiconductor chip 1 is radiated outside through the bed 13, connecting pins 15, heat radiation plate 14, insulation tape 16 and lead frame 17.

A process of manufacturing the above-described resin-sealed semiconductor device according to the present invention, will now be described in brief.

To manufacture a resin-sealed semiconductor device, a semiconductor chip 11, a bed 13, a heat radiation plate 14 and a lead frame 17 are prepared in advance. The semiconductor chip 11 is obtained by dicing a wafer. The bed 13 and heat radiation plate 14 are formed integrally with each other by etching or punching a copper (Cu) plate, and a difference in level is caused between them by depression. The lead frame 17 is formed by etching or punching a Cu plate or the like.

The lead frame 17 is bonded to the undersurface of the heat radiation plate 14 through an insulation tape 16. In this case, a thermoplastic tape is softened at a high temperature to stick the heat radiation plate 14 on inner leads 17a of the lead frame 17 and then hardened at a normal temperature to fix them to each other.

The semiconductor chip 11 is mounted on the bed 13 through die bonding paste 12 and then fixed thereto by curing the paste.

Wire bonding is thus performed when the inner leads 17a are kept at a suitable temperature (e.g., 240° C. to 270° C.) by heat generated from the heat source. Thus, the electrode pads 11a of the chip 11 are inner leads 17a are connected to each other by the Au wires 18.

After that, the semiconductor chip 11 bonded to the bed 13, is sent to the nest molding step, in which it is packaged by resin 19. When the packaging is finished, the outer leads 17b of the lead frame 17 are formed to have a predetermined shape. The outer leads 17b are cut and separated from one another, thus completing the resin-sealed semiconductor device as shown in FIGS. 4A and 4B.

As is understood from the above, the device of the first embodiment can be constituted advantageously to bonding without deteriorating in heat radiation characteristic and, in other words, the heat radiation plate is provided around the bed and on the slightly higher level than that of the bed, and the inner leads are fixed to the undersurface of the heat radiation plate. It is thus unnecessary to use a tape, which deteriorates in wire bonding, under the bonding points and accordingly it is possible to transmit the heat generated from the heat source directly to the inner leads, with the result that bonding can stabilized without being influenced by the insulation tape. Consequently, the bonding can be greatly improved without degrading in heat radiation characteristic.

Furthermore, neither a thermosetting tape which generates an out gas contaminating the inner leads, nor a thermoplastic tape having a high glass transition temperature (Tg=240° C. or higher) has to be used in order to keep bonding the bed and inner leads. For this reason, the restrictions on tape usable for an insulation tape can be relaxed, and the degree of freedom to select a tape can be extended.

The device of the first embodiment is so constituted that the heat generated from the semiconductor chip 1 is radiated outside through the bed 13, connecting pins 15, heat radiation plate 14, insulation tape 16 and lead frame 17. However, as illustrated in FIGS. 5 to 7, the device can be constituted so as to obtain a greater cooling effect.

FIG. 5 is a schematic cross-sectional view of the resin-sealed semiconductor device in which the heat radiation plate 14 is exposed from the upper surface of the resin 19. FIG. 6 is a schematic cross-sectional view of the resin-sealed semiconductor device in which the bed 13 is exposed from the undersurface of the resin 19. FIG. 7 is a schematic cross-sectional view of the resin-sealed semiconductor device in which the bed 13 and heat radiation plate 14 are exposed from the surface of the resin 19.

The outer leads 17b need not be always formed such that the semiconductor chip 11 is mounted on the upper surface of the bed 13, as illustrated in FIG. 4B. For example, as shown in FIG. 8, they can be formed such that the chip 11 is mounted on the undersurface of the bed 13.

The heat radiation plate 14 can be set flush with the bed 13 as shown in FIG. 9. In this example, the semiconductor chip 11 is mounted on the upper surface of the bed 13, and the inner leads 17a are bonded onto the undersurface of the radiation plate 14 through the insulation tape 16. Thus, the inner leads 17a and electrode pads 11a are connected by the Au wires, respectively in the openings formed by the bed 13 and plate 14.

Figure 10A:
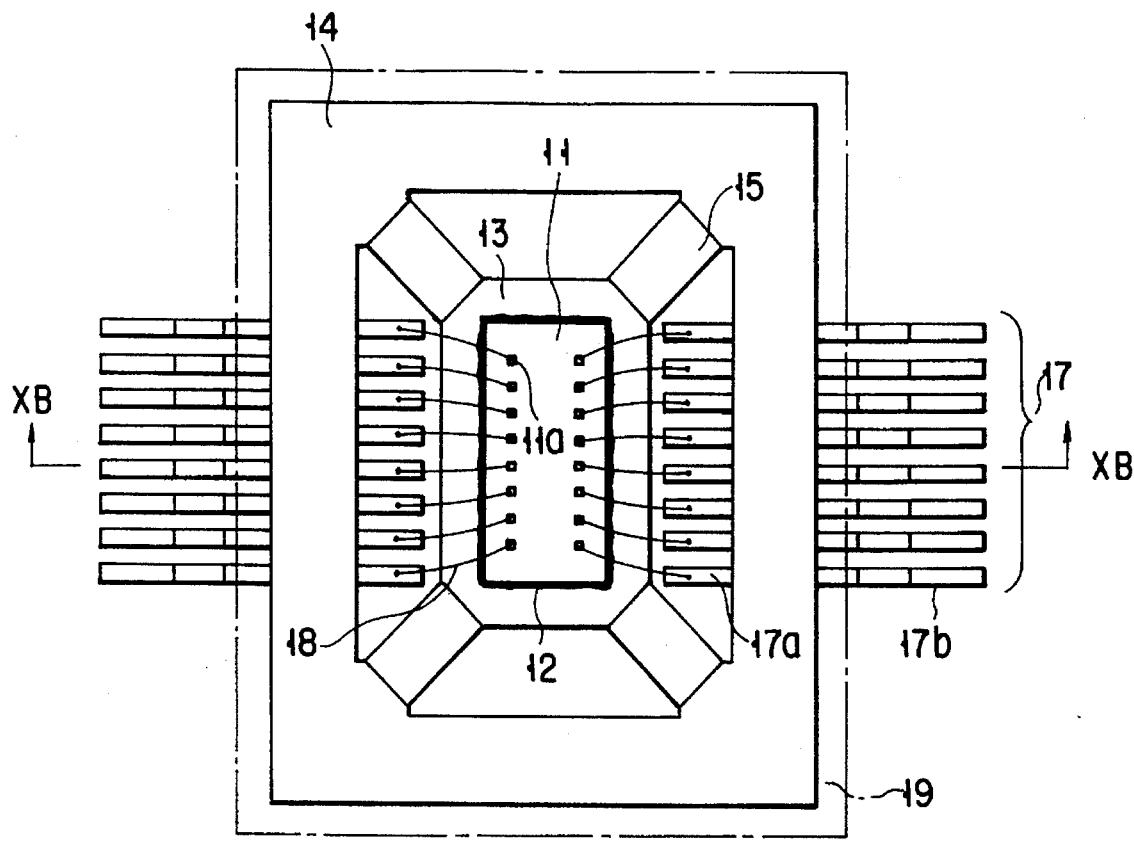
FIG. 10A is a plan view schematically showing the constitution of a resin-sealed semiconductor device (QFP type device) according to a second embodiment of the present invention.
Figure 10B:
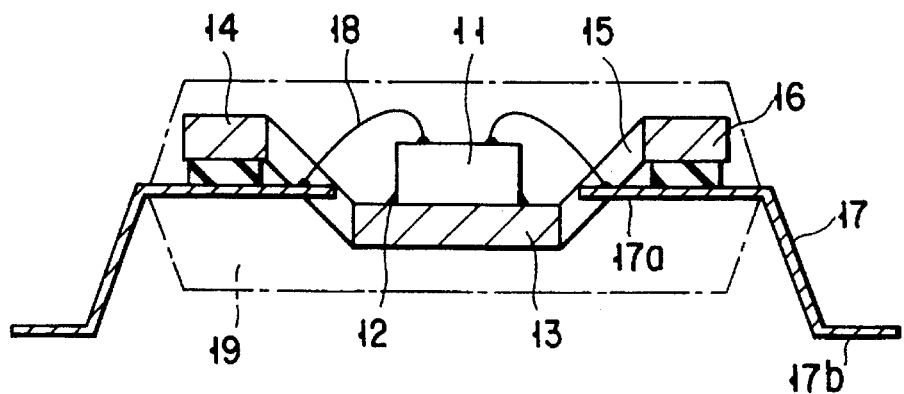
FIG. 10B is a schematic cross-sectional view taken along the line XB—XB of FIG. 10A.
Figure 11A:
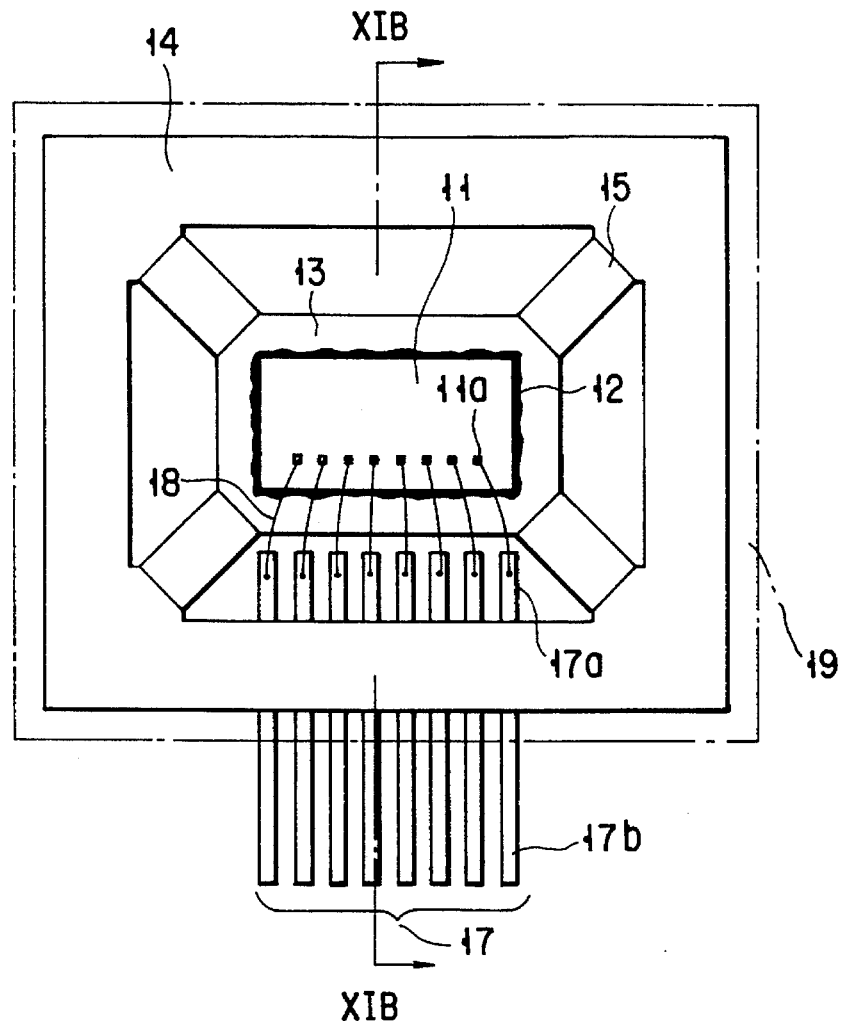
FIG. 11A is a plan view schematically showing the constitution of a resin-sealed semiconductor device (QFP type device) according to a third embodiment of the present invention.
Figure 11B:
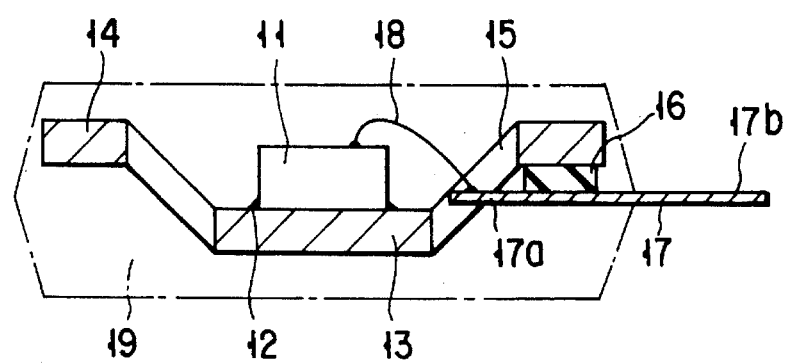
FIG. 11B is a schematic cross-sectional view taken along the line XIB—XIB of FIG. 11A.

The present invention is not limited to the QFP type resin-sealed semiconductor device. For example, a DIP (Dual In-line Package) type resin-sealed semiconductor device as shown in FIGS. 10A and 10B, an SIP (Single In-line Package) type resin-sealed semiconductor device as shown in FIGS. 11A and 11B, and the like can be employed. In such devices, too, the heat generated from the heat source can be transmitted directly to the inner leads 17a by setting the undersurfaces of the inner leads 17a almost flush with that of the bed 13. If, moreover, the bed 13 and heat radiation plate 14 are exposed from the surface of the resin 19, a greater cooling effect can be obtained.

In each device described above, the bed 13 and heat radiation plate 14 need not be always formed integrally with each other, but they can be formed separately and bonded to each other by a member of high conductivity. In this case, the heat radiation plate 14 need not be shaped like a frame.

Similarly, the heat source for bonding need not be always provided under the bed 13 including the inner leads 17a, but it can be done at least under the inner leads 17a such that heat can reliably be transmitted to the bonding points on the inner leads 17a.

It is needless to say that the size of each structural element and the position of the heat radiation plate 14 with respect to the bed 13 can be varied with the shape and size of the semiconductor chip 11 and the finished resin-sealed semiconductor device.

It is also needless to say that various changes and modifications can be made without departing from the scope of the subject matter of the present invention.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A resin-sealed semiconductor device comprising:
   a semiconductor element having a plurality of electrodes;
   a heat conducting component having an element mounting section on which said semiconductor element is mounted, and a heat radiation section extending around and spaced away from said element mounting section to provide openings between the element mounting section and the heat radiation section;
   a plurality of leads underlying an undersurface of said heat radiation section, and having end portions extending to the openings between said element mounting section and said heat radiation section, the end portions of said plurality of leads having bonding points from which bonding wires extend to the plurality of electrodes of said semiconductor element;
   an insulating tape fixing the plurality of leads to the undersurface of the heat radiation section, the insulating tape being spaced from the bonding points and the plurality of electrodes; and
   a sealing member encapsulating said semiconductor element including said bonding points of said plurality of leads.

2. The resin-sealed semiconductor device according to claim 1, wherein said heat conducting component is one piece of material having high thermal conductivity.

3. The resin-sealed semiconductor device according to claim 1, wherein said heat radiation section and said element mounting section are located at different levels, said element mounting section having a bottom surface substantially flush with undersurfaces of said plurality of leads.

4. The resin-sealed semiconductor device according to claim 1, wherein said element mounting section is exposed through an outer surface of said sealing member.

5. The resin-sealed semiconductor device according to claim 1, wherein said heat radiation section is exposed through an outer surface of said sealing member.

6. The resin-sealed semiconductor device according to claim 1, wherein the insulating tape fixing said plurality of leads onto the undersurface of said heat radiation section is a thermoplastic tape.

7. A resin-sealed semiconductor device comprising:
   a semiconductor element having a plurality of electrodes;
   a thermally conductive component having an element mounting section on which said semiconductor element is mounted, and a heat radiation section extending around and spaced away from said element mounting section to provide openings between the element mounting section and the heat radiation section;
   a plurality of leads underlying an undersurface of said heat radiation section, said leads having end portions extending to the openings between said element mounting section and said heat radiation section, the end portions of said plurality of lead wires having bonding points from which bonding wires extend to the plurality of electrodes of said semiconductor element;
   an insulating tape fixing the plurality of leads to the undersurface of the heat radiation section, the insulating tape being spaced from the bonding points and the plurality of electrodes; and
   a sealing member for encapsulating said semiconductor element and bonding points of said plurality of leads, at least one of said heat radiation section and said element mounting section being exposed through a surface of the sealing member.

8. The resin-sealed semiconductor device according to claim 7, wherein said thermally conductive component is monolithic.

9. The resin-sealed semiconductor device according to claim 7, wherein said heat radiation section and said element mounting section are located at different levels, said element mounting section having a bottom surface substantially flush with undersurfaces of said plurality of leads.

10. The resin-sealed semiconductor device according to claim 7, wherein said insulating tape is a thermoplastic tape.

* * * * *